United States Patent
Yeom et al.

(10) Patent No.: US 7,842,159 B2
(45) Date of Patent: *Nov. 30, 2010

(54) INDUCTIVELY COUPLED PLASMA PROCESSING APPARATUS FOR VERY LARGE AREA USING DUAL FREQUENCY

(75) Inventors: Geun-Young Yeom, Seoul (KR); Kyong-Nam Kim, Daejeon (KR)

(73) Assignee: Sungkyunkwan University Foundation for Corporate Collaboration, Gyeonggi-Do (KR)

( * ) Notice: Subject to any disclaimer, the term of this patent is extended or adjusted under 35 U.S.C. 154(b) by 1156 days.

This patent is subject to a terminal disclaimer.

(21) Appl. No.: 11/428,681

(22) Filed: Jul. 5, 2006

(65) Prior Publication Data

US 2007/0012250 A1 Jan. 18, 2007

(30) Foreign Application Priority Data

Jul. 14, 2005 (KR) ...................... 10-2005-0063932
Jun. 30, 2006 (KR) ...................... 10-2006-0060244

(51) Int. Cl.
*C23C 16/00* (2006.01)
*H01L 21/306* (2006.01)
(52) U.S. Cl. .................... 156/345.48; 118/723 AN; 118/723 I
(58) Field of Classification Search ............... 118/723 I, 118/723 IR, 723 AN; 156/345.48, 345.49; 315/111.51
See application file for complete search history.

(56) References Cited

U.S. PATENT DOCUMENTS

| | | | | |
|---|---|---|---|---|
| 5,571,366 | A * | 11/1996 | Ishii et al. | 156/345.26 |
| 7,338,577 | B2 * | 3/2008 | Yeom et al. | 156/345.48 |
| 2004/0221814 | A1 * | 11/2004 | Yeom et al. | 118/723 I |
| 2005/0199186 | A1 * | 9/2005 | Yeom et al. | 118/723 AN |
| 2009/0133840 | A1 * | 5/2009 | Yeom et al. | 156/345.48 |

* cited by examiner

*Primary Examiner*—Luz L. Alejandro
(74) *Attorney, Agent, or Firm*—Sughrue Mion, PLLC (57) ABSTRACT

A plasma processing apparatus for a very large area using a dual frequency is provided. The apparatus includes: a stage loading a substrate to be subjected to an etching or deposition process; a reaction chamber detachably coupled with the stage and having a plasma source region; a cover covering the reaction chamber; an assembly frame coupling the reaction chamber with the cover; first and second antenna sources disposed in the plasma source region, and having a plurality of antenna assemblies disposed in parallel, the plurality of antenna assemblies having a power supply connected to one side thereof and a ground connected to the other side thereof; and a plurality of magnet assemblies disposed on both sides of each antenna assembly, wherein the first and second antenna sources include m and m-1 antenna assemblies to which the same power is applied, respectively, and the antenna assemblies of the first antenna source and the antenna assemblies of the second antenna source are alternately disposed; and wherein input power applied to the first antenna source and input power applied to the second antenna source are different in magnitude and applied at the same time. Thereby, uniformity of plasma is improved to the maximum extent, so that it is possible to obtain a higher plasma density.

3 Claims, 14 Drawing Sheets

INDUCTIVELY COUPLED PLASMA PROCESSING APPARATUS FOR VERY LARGE AREA USING DUAL FREQUENCY

BACKGROUND OF THE INVENTION

1. Field of the Invention

The present invention relates to a plasma processing apparatus for a very large area using a dual frequency, and more particularly, to a plasma processing apparatus for a very large area using a dual frequency, capable of improving plasma uniformity to the maximum extent to obtain a higher plasma density.

2. Description of the Prior Art

In general, an inductively coupled plasma (ICP) processing apparatus includes a spiral antenna installed at an upper outer portion of a reaction chamber, in which a plasma etching process is performed, with a dielectric substance interposed therebetween. The ICP processing apparatus applies radio-frequency (RF) induced power to the spiral antenna, induces an electric field in the reaction chamber, and thereby generates plasma. The ICP processing apparatus has a very simple structure compared to an electron cyclotron resonance (ECR) plasma processing apparatus or a helicon-wave excited plasma (HWEP) processing apparatus, and can generate the plasma over a large area in a relatively easy manner. For this reason, the ICP processing apparatus has been applied in various fields and research into ICP apparatuses is ongoing.

Figure 1A:
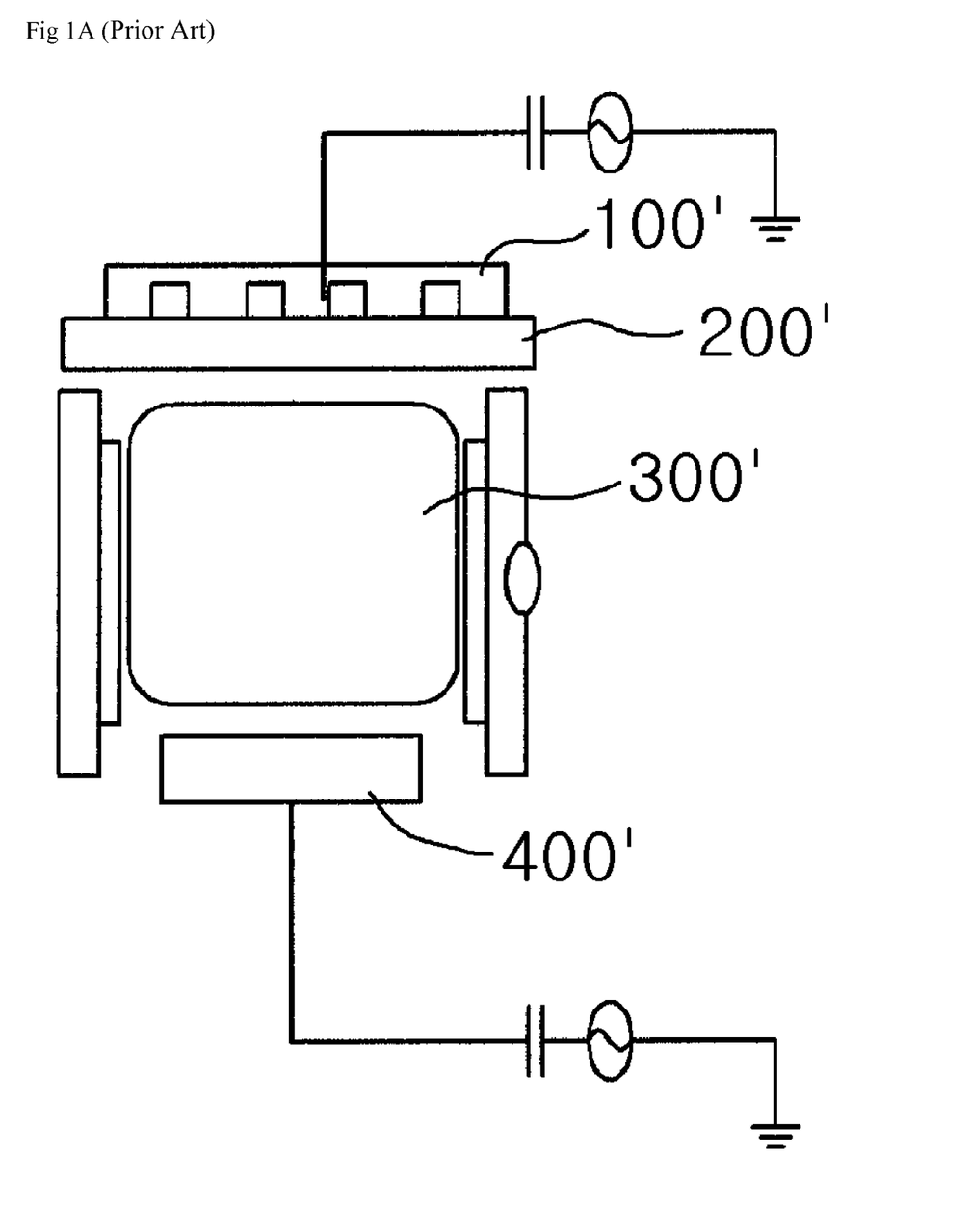
FIG. 1A illustrates a structure of a chamber in a conventional inductively coupled plasma (ICP) processing apparatus.

The construction of a chamber in a conventional ICP processing apparatus is illustrated in FIG. 1A and will be briefly described below.

An antenna source 100' is disposed on the uppermost side centering around a chamber 300' in such a manner that the antenna source 100' is exposed to ambient air. A dielectric member 200' is interposed between the antenna source 100' and the chamber 300' so as to insulate the antenna source 100' from the chamber 300' while maintaining a vacuum state. Further, an etching target 400' is placed below the chamber 300'.

Figure 1B:
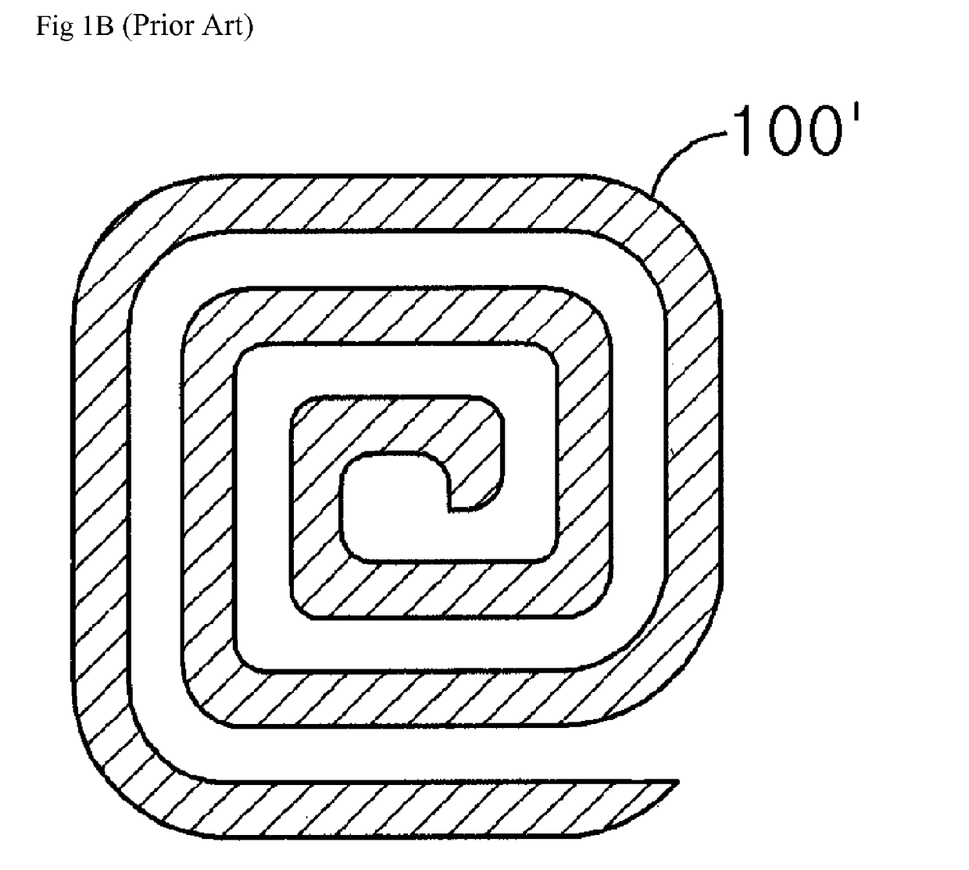
FIG. 1B illustrates a schematic structure of an antenna source in a conventional ICP processing apparatus.

A spiral antenna source used for the chamber of the conventional ICP processing apparatus is illustrated in FIG. 1B.

However, as the volume and surface area of the etching target 400' increase, such a spiral antenna source causes various problems.

First, if the chamber has a large area, the dielectric member for maintaining the vacuum state between the antenna source and the chamber considerably increases in size and thickness. Hence, the cost of production increases, and efficiency is lowered due to an increased distance between the antenna source and plasma.

In addition, because the reaction chamber has a large area, the antenna source also increases in length. Thus, loss of applied power due to resistance of the antenna increases, and an etch rate is lowered due to non-uniformity of the plasma Moreover, when a power supply capable of applying power at a frequency of 13.56 MHz is used, a standing wave effect (two wave pulses having the same amplitude and frequency and propagating in opposite directions interfere to form standing waves) may occur at a half wavelength portion of the antenna source, so that the area of the chamber can no more be enlarged.

In order to solve these problems, the present applicant filed Korean Patent Application No. 2003-28849, titled "Inductively Coupled Plasma Processing Apparatus Having Internal linear Antenna for Large Area Processing," and No. 2004-17227, titled "Inductively Coupled Plasma Apparatus Using Magnetic Field." The constructions of the inventions disclosed in these two patent applications will be briefly described below.

Figure 2:
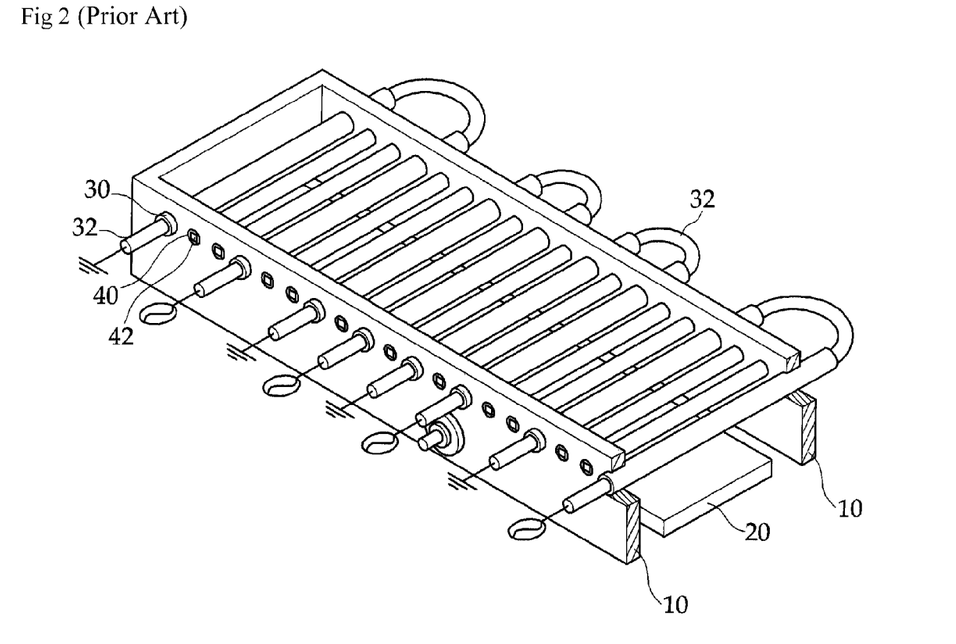
FIG. 2 is a perspective view illustrating the construction of an ICP processing apparatus for a large area disclosed in Korean Patent Application No. 2003-28849 filed by the present applicant.

First, as illustrated in FIG. 2, the inductively coupled plasma processing apparatus for a large area processing disclosed in Korean Patent Application No. 2003-28849 includes a reaction chamber 10, a plurality of linear antennas 32 that receive induced power, are horizontally arranged spaced apart from each other by a predetermined distance at an inner upper portion of the reaction chamber 10, and have adjacent first ends coupled to each other with a predetermined curvature at an outer portion of the reaction chamber 10, and at least one magnet 42 disposed adjacent to the linear antennas 32 so as to generate a magnetic field perpendicular to an electric field generated by the linear antennas 32 in such a manner that electrons move along spiral trajectories.

Here, the linear antennas 32 and the magnets 42 are enclosed by protective tubes 30 and 40 formed of quartz in order to prevent direct exposure to plasma, respectively. A reference number 20 indicates a stage on which a substrate to be etched (not shown) is loaded.

Figure 3:
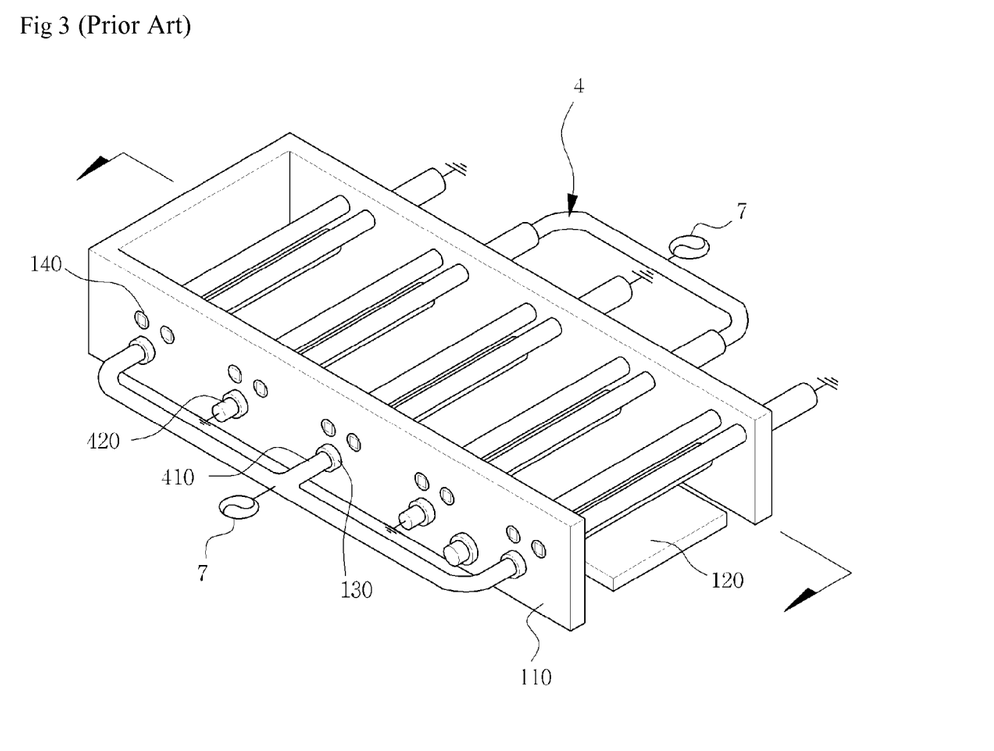
FIG. 3 is a perspective view illustrating the construction of a plasma processing apparatus for a large area disclosed in Korean Patent Application No. 2004-17227 filed by the present applicant.

Next, as illustrated in FIG. 3, the inductively coupled plasma apparatus using a magnetic field disclosed in Korean Patent Application No. 2004-17227 includes a reaction chamber 110 provided with a stage 120 on which a substrate to be etched (not shown) is loaded, and at least one antenna source 4 having a plurality of antenna rods 410 and 420 that are alternately aligned in parallel, wherein the antenna rods 410 and 420 are each provided thereabove with a plurality of magnets.

Here, the antenna rods 410 and 420 and the magnets are also enclosed by protective tubes 130 and 140 formed of quartz, respectively, in order to prevent direct exposure to plasma.

Each antenna source 4 is connected to an RF induced power section 7 on one side thereof and is grounded on the other side thereof.

However, because the protective tubes for protection from the plasma are formed of quartz, they are easily corroded by corrosive gases. When the corrosion becomes serious, the tubes themselves are damaged and the vacuum state cannot be maintained. Such a situation can be very dangerous.

Further, when the antenna rods and the magnets are replaced, they are separated from the wall of the reaction chamber one by one and then assembled again. As such, the replacement work requires much time and furthermore is not easy.

SUMMARY OF THE INVENTION

Accordingly, the present invention has been made to solve the above-mentioned problems occurring in the prior art, and an objective of the present invention is to provide a plasma processing apparatus for a very large area using a dual frequency, in which input power at the dual frequency is used to improve plasma uniformity to the maximum extent, thereby obtaining a higher plasma density.

In order to accomplish this objective, according to an aspect of the present invention, there is provided a plasma processing apparatus for a very large area. The apparatus comprises: a stage loading a substrate to be subjected to an etching or deposition process; a reaction chamber detachably coupled with the stage and having a plasma source region; a cover covering the reaction chamber; an assembly frame coupling the reaction chamber with the cover; first and second antenna sources disposed in the plasma source region, and having a plurality of antenna assemblies disposed in parallel, the plurality of antenna assemblies having a power supply connected to one side thereof and a ground connected to the other side thereof; and a plurality of magnet assemblies disposed on both sides of each antenna assembly, wherein the first and second antenna sources include m and m-1 antenna assemblies to which the same power is applied, respectively, and the antenna assemblies of the first antenna source and the antenna assemblies of the second antenna source are alternately disposed; and wherein input power applied to the first antenna source and input power applied to the second antenna source are different in magnitude and applied at the same time.

According to another aspect of the present invention, there is provided a plasma processing apparatus for a very large area. The apparatus comprises: a stage loading a substrate to be subjected to an etching or deposition process; a reaction chamber detachably coupled with the stage and having a plasma source region; a cover covering the reaction chamber; an assembly frame coupling the reaction chamber with the cover; first and second antenna sources disposed in the plasma source region, and having a plurality of antenna assemblies disposed in parallel, the plurality of antenna assemblies having a power supply connected to one side thereof and a ground connected to the other side thereof; and a plurality of magnet assemblies disposed on both sides of each antenna assembly, wherein the first and second antenna sources include m and m-1 antenna assemblies to which the same power is applied, respectively, and the antenna assemblies of the first antenna source and the antenna assemblies of the second antenna source are alternately disposed; and wherein a frequency applied to the first antenna source and a frequency applied to the second antenna source are different in magnitude and applied at the same time.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF EXEMPLARY EMBODIMENTS

Hereinafter, exemplary embodiments of the present invention will be described with reference to the accompanying drawings. In the following description and drawings, the same reference numerals are used to designate the same or similar components, and components will only be described once.

Figure 4:
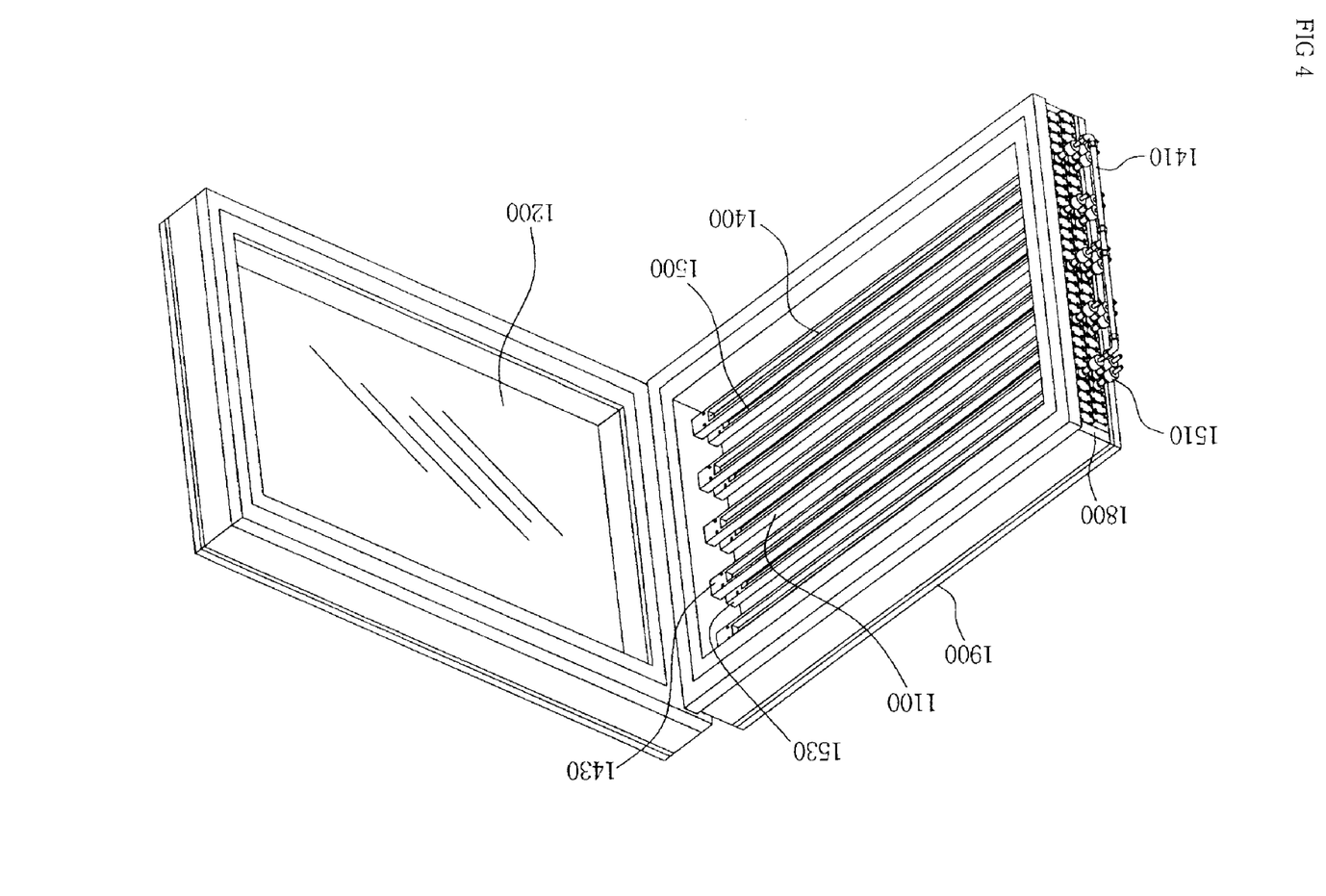
FIG. 4 is a perspective view illustrating a module-type plasma processing apparatus for a very large area in accordance with an exemplary embodiment of the present invention.
Figure 5:
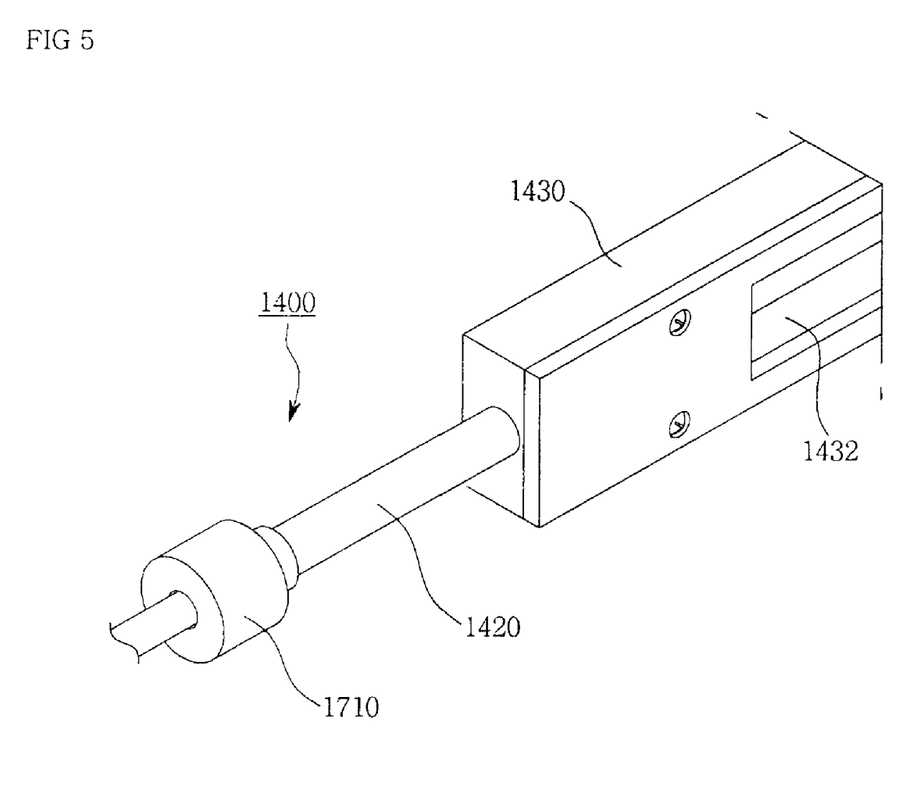
FIG. 5 is a perspective view illustrating a structure of the antenna assembly of FIG. 4.

Among the accompanying drawings, FIG. 4 illustrates an entire structure of a plasma processing apparatus for a very large area using a dual frequency in accordance with an exemplary embodiment of the present invention, and FIGS. 5 to 8 each illustrate a structure of the antenna assembly of FIG. 4. Herein, a magnet assembly has the same structure as an antenna assembly, except that a magnet is used instead of an antenna.

First, a reaction chamber 1100 is provided with a stage 1200 capable of loading a substrate (not shown) that will be subjected to a plasma etching or deposition process. The stage 1200 may be adapted to move up and down. As illustrated, the reaction chamber 1100 having antenna and magnet assemblies is adapted to be separated from the stage on which the substrate is loaded. Therefore, the reaction chamber 1100 is coupled with the stage only when actually used, and usually is separated from the stage.

Further, the reaction chamber 1100 may be additionally provided with an exhaust line connected with a vacuum pump (not shown) at a bottom or a sidewall thereof.

The stage 1200 can be connected with a bias power supply so as to apply bias power to the stage 1200. In addition, the stage 1200 may be additionally provided with a bias voltage measurement unit (not shown) capable of measuring bias voltage applied to the stage 1200.

Meanwhile, the reaction chamber 1100 has a cover 1900, a lower portion of which is a plasma source region for generating plasma and is provided with an antenna source. In the antenna source, antenna assemblies 1400 are disposed in parallel and horizontally spaced apart from each other.

In addition, magnet assemblies 1500 are each disposed on both sides of each of the antenna assemblies 1400.

Antenna rods 1410 are assembled into an assembly frame 1800 of the cover 1900 and the reaction chamber 1100 with assembly cases 1430 made of Teflon® interposed therebetween. To be specific, as illustrated in FIGS. 5 to 8, each antenna rod 1410 is inserted into through holes 1431 formed at both longitudinal ends of the assembly case 1430, and each antenna rod 1410 is accommodated in a recess 1432 formed in each assembly case 1430 in a longitudinal direction.

Figure 6:
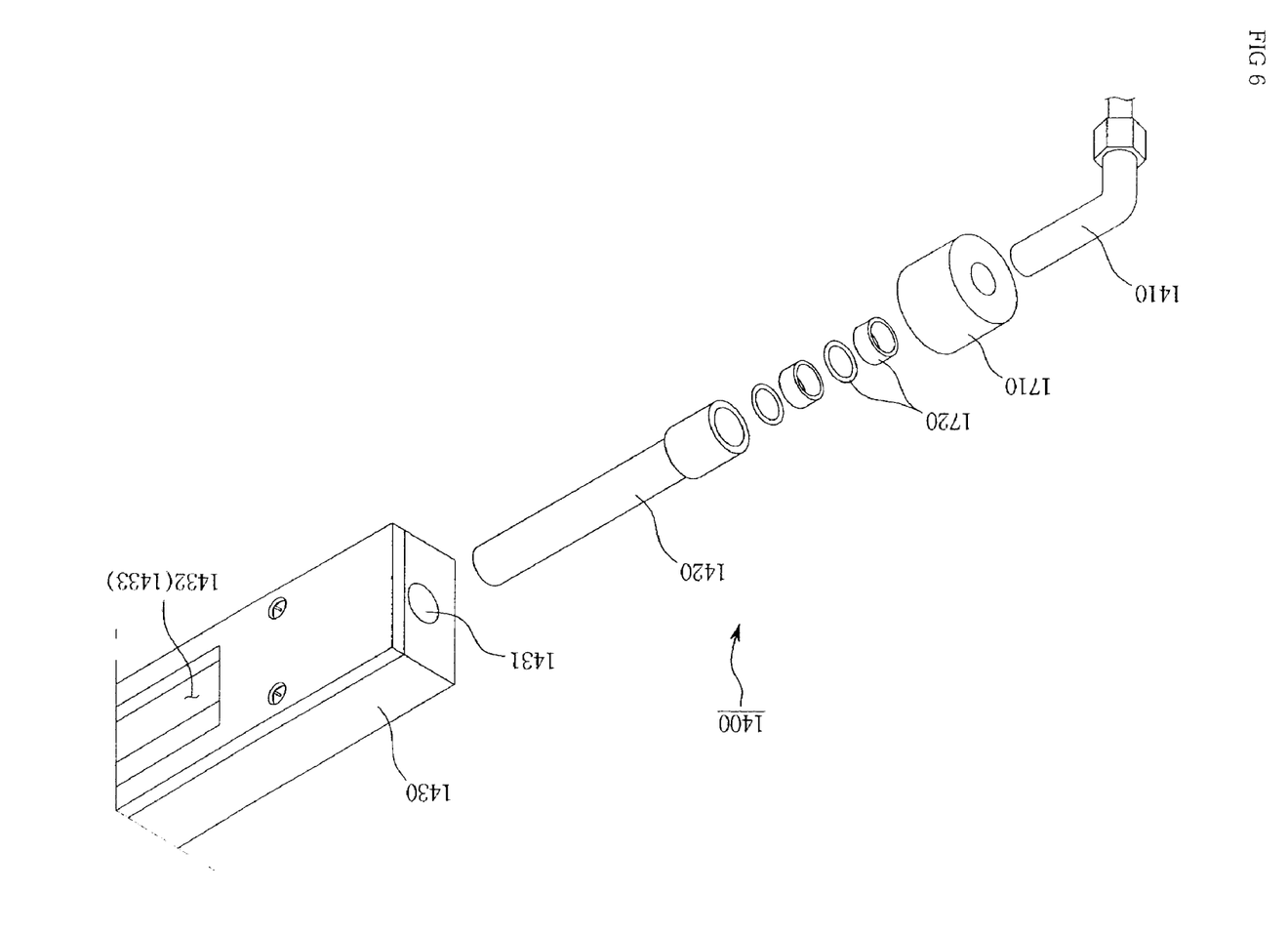
FIG. 6 is an exploded perspective view illustrating a structure of the antenna assembly of FIG. 4.
Figure 8:
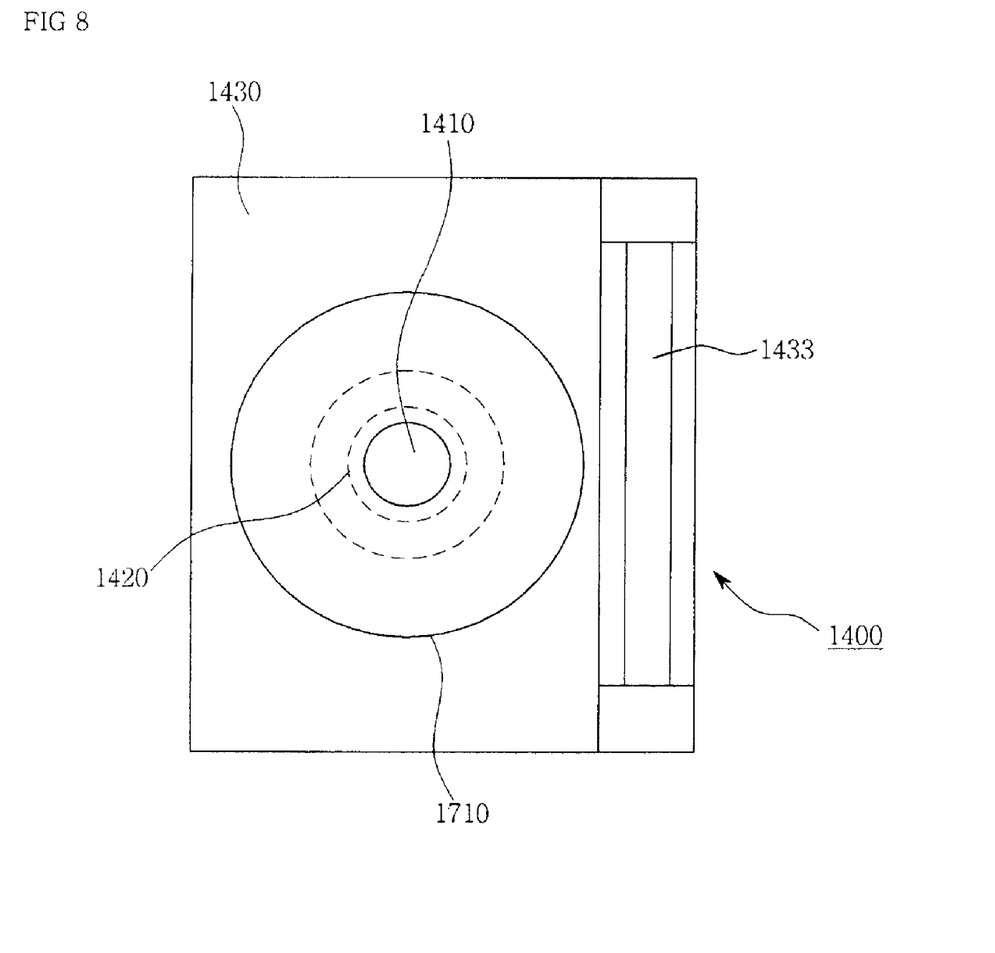
FIG. 8 is a perspective view illustrating a structure of an antenna or magnet assembly according to the present invention.

Further, the antenna rods 1410 are surrounded by resin pipes 1420, respectively, with vacuum spaces formed therebetween. As illustrated in FIGS. 6 and 8, a vacuum state of each vacuum space is maintained by installing a connector 1710 and an O-ring 1720 for sealing between each antenna rod 1410 and each resin pipe 1420 and between each magnet 1510 and each resin pipe outside the reaction chamber 1100.

The resin pipes are made of a Teflon® material, such as polytetrafluoroethylene (PTFE), perfluoroalkoxy (PFA), fluoroethylenepropylene (FEP), or polyvinylidene fluoride (PVDF).

In addition, the recesses 1432 of the assembly cases 1430 are covered with quartz windows 1433, respectively. Because the quartz windows 1433 are opposite to the stage 1200, they are installed in order to protect the antenna rods 1410 against plasma.

Meanwhile, each magnet assembly 1500 has the same structure as each antenna assembly 1400.

To be more specific, each magnet assembly 1500 includes an assembly case 1530 that is formed with through holes at both longitudinal ends thereof and in which a recess 1532 is formed in a longitudinal direction, a quartz window covering the recess 1532 of the assembly case 1530, a magnet 1510 inserted into the through holes of the assembly case 1530, and a resin pipe installed around the magnet 1510 with a vacuum space formed therebetween. The magnet assemblies 1500 pass through the reaction chamber 1100.

Figure 7:
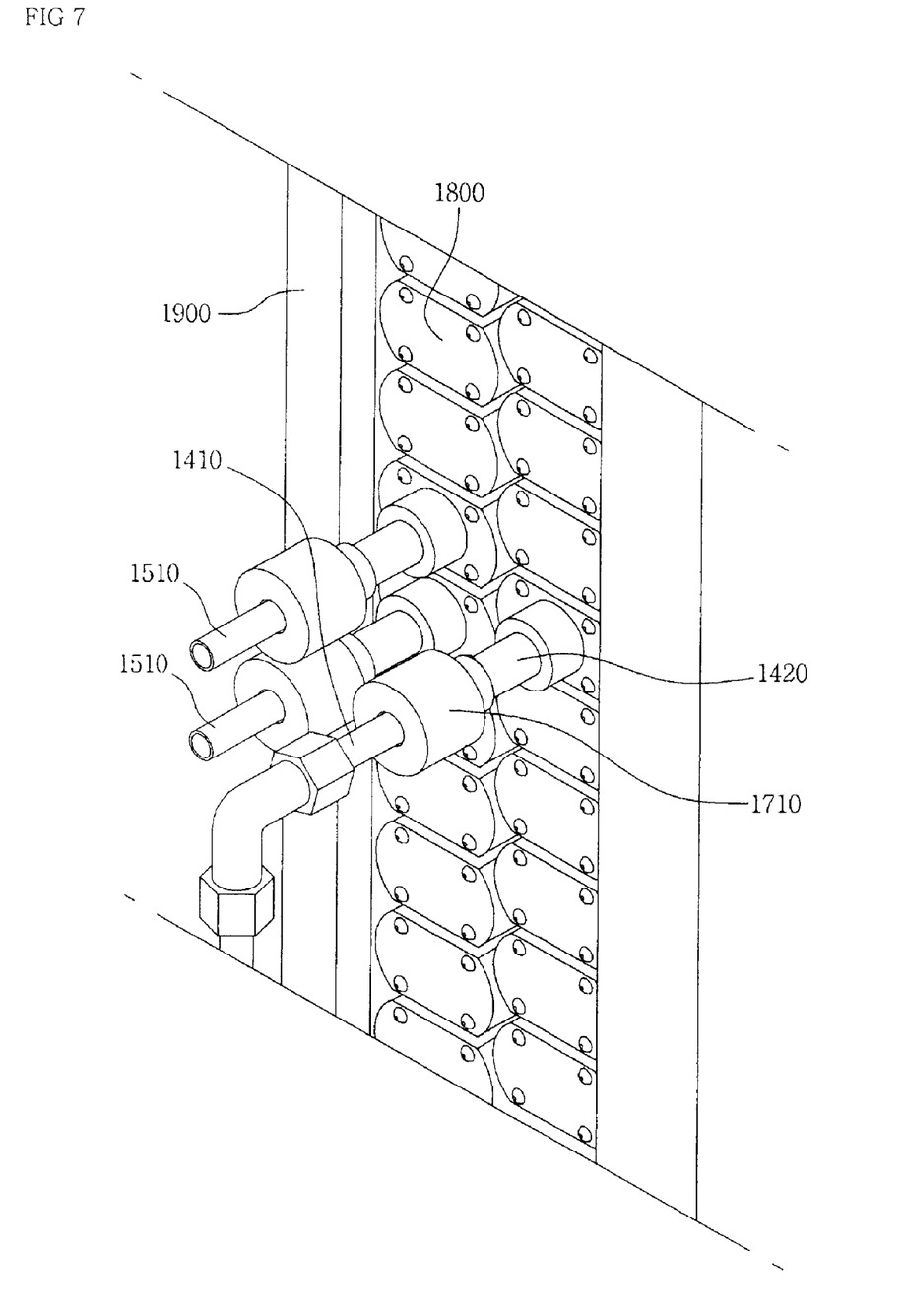
FIG. 7 is a perspective view illustrating an external structure of the antenna and magnet assemblies of FIG. 4.

As illustrated in FIG. 7, the magnet assemblies 1500 are disposed above the antenna assemblies 1400. The magnets 1510 are permanent magnets having an N pole and an S pole. The magnets 1510 are disposed above the antenna assemblies 1400 so that the magnetic field is applied to the antenna source.

Because the N-pole and S-pole are alternately disposed, the direction of the magnetic field between the N-pole and S-pole permanent magnets is perpendicular to the direction of the electric field, so that electrons follow a helical trajectory within the magnetic and electric fields.

The spiral motion of the electrons increases the length of each electron's trajectory and thus increases probability of collision, i.e., collision frequency, between electrons and neutrons. As the collision probability between electrons and neutrons increases due to the helical motion of the electrons caused by the magnetic field, ion density increases and mobility of the electrons decreases. Thereby, electron loss decreases.

Meanwhile, the assembly frame 1800 on which the antenna assemblies 1400 and the magnet assemblies 1500 are mounted can be installed so as to freely move in the longitudinal direction of the cover 1900. With this construction, it is possible to replace only the assembly frame 1800 by another frame on which the antenna assemblies 1400 and the magnet assemblies 1500 having different specifications and numbers are mounted, so that the assembly frame 1800 can be easily reconstructed.

Figure 9:
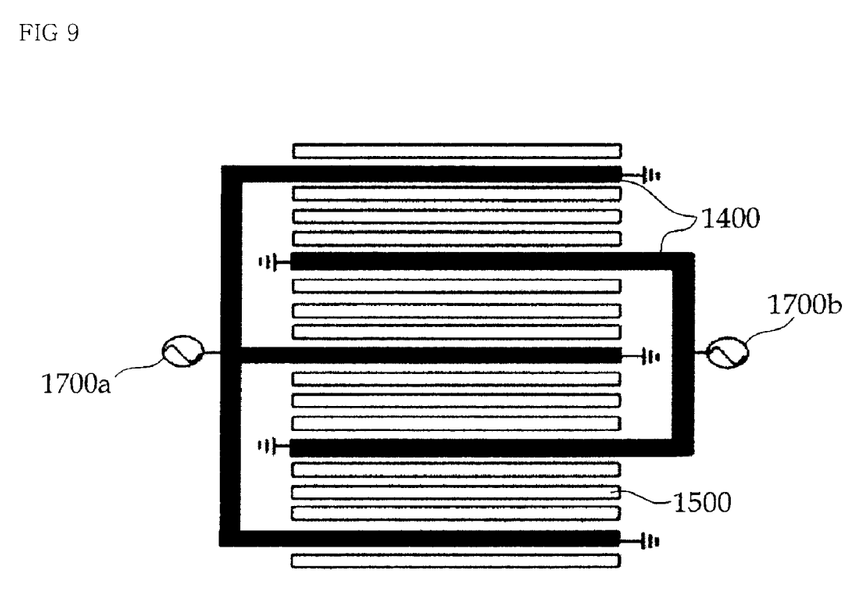
FIG. 9 is a plan view illustrating the arrangement of antenna sources and magnets.

As illustrated in FIG. 9, the antenna source includes the plurality of antenna assemblies 1400 connected in parallel. Further, two comb-type antenna sources are alternately disposed opposite to each other. To this end, the left-hand antenna source is set to have m antenna assemblies, and the right-hand antenna source coupled is set to have m-1 antenna assemblies. Thereby, the antenna assemblies of the right-hand antenna source are alternately inserted between the antenna assemblies of the left-hand antenna source. Here, the expressions left-hand and right-hand are merely used to facilitate easy understanding of, and not to limit, the configuration being described.

It is also possible to set the numbers of antenna assemblies of the left-hand and right-hand antenna sources to m-1 and m, respectively, and alternately dispose the antenna assemblies of the left-hand and right-hand antenna sources.

Figure 10:
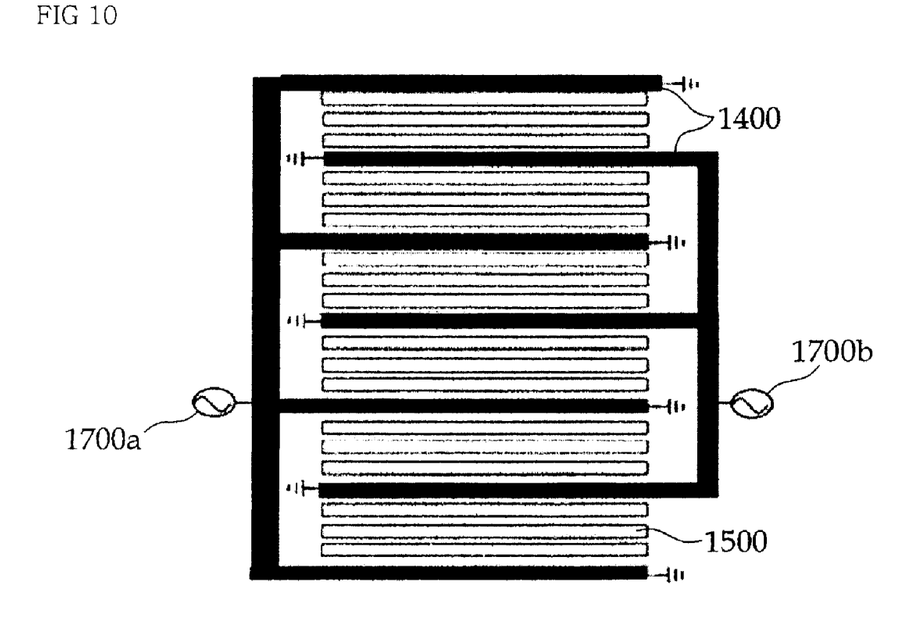
FIG. 10 is a plan view illustrating another arrangement of antenna sources and magnets.

Further, as illustrated in FIG. 10, in order to generate plasma exceeding an ordinarily used area, the numbers of the left-hand and right-hand antenna assemblies linearly increase. In this case, it is possible to obtain a high uniformity of plasma.

One side of the antenna sources is connected to RF induced power supplies 1700a and 1700b respectively, and the other side is grounded.

Here, the RF induced power supply 1700a connected to the left-hand antenna source, and the RF induced power supply 1700b connected to the right-hand antenna source each apply different powers, and preferably, the input power having a frequency of 2 MHz and 13.56 MHz, respectively, at the same time.

More preferably, the input power having a frequency of 2 MHz is applied to the antenna source having m antenna assemblies, and the input power having a frequency of 13.56 MHz is applied to the antenna source having m-1 antenna assemblies.

In this manner, because a dual frequency where left- and right-hand frequencies are different from each other is used, it is possible to obtain better plasma uniformity than the prior art.

Embodiment 1

In the plasma processing apparatus of the present invention as illustrated in FIG. 9, input power having a frequency of 13.56 MHz applied by the RF induced power supply 1700b connected to the right-hand antenna source was fixed to 5 kW, input power having a frequency of 2 MHz applied by the RF induced power supply 1700a connected to the left-hand antenna source increased from 200 W to 900 W, and uniformity of plasma was measured. The results are shown in the graph of FIG. 11.

Figure 11:
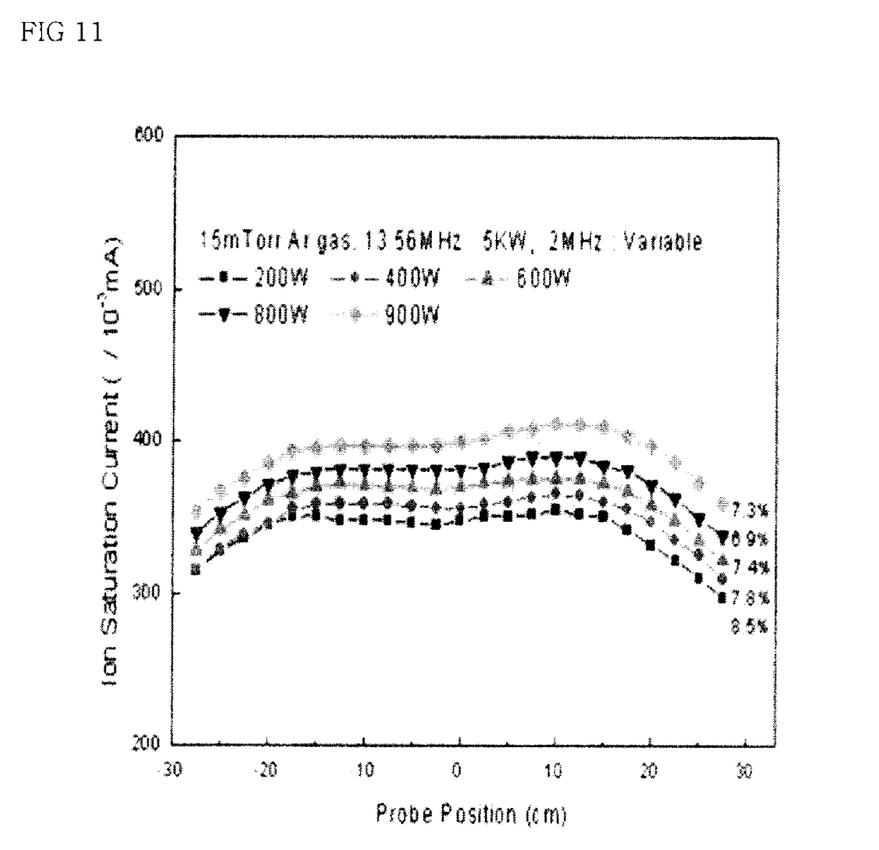
FIG. 11 is a graph of plasma uniformity using a plasma processing apparatus according to the present invention.

As shown in FIG. 11, a high plasma uniformity of about 8% on average, and of maximum 6.9% was obtained.

Embodiment 2

In the plasma processing apparatus of the present invention as illustrated in FIG. 9, input power having a frequency of 13.56 MHz applied by the RF induced power supply 1700b connected to the right-hand antenna source was fixed to 4 kW and 5 kW, input power having a frequency of 2 MHz applied by the RF induced power supply 1700a connected to the left-hand antenna source was increased, and plasma density was measured. The results are shown in the graph of FIG. 12.

Figure 12:
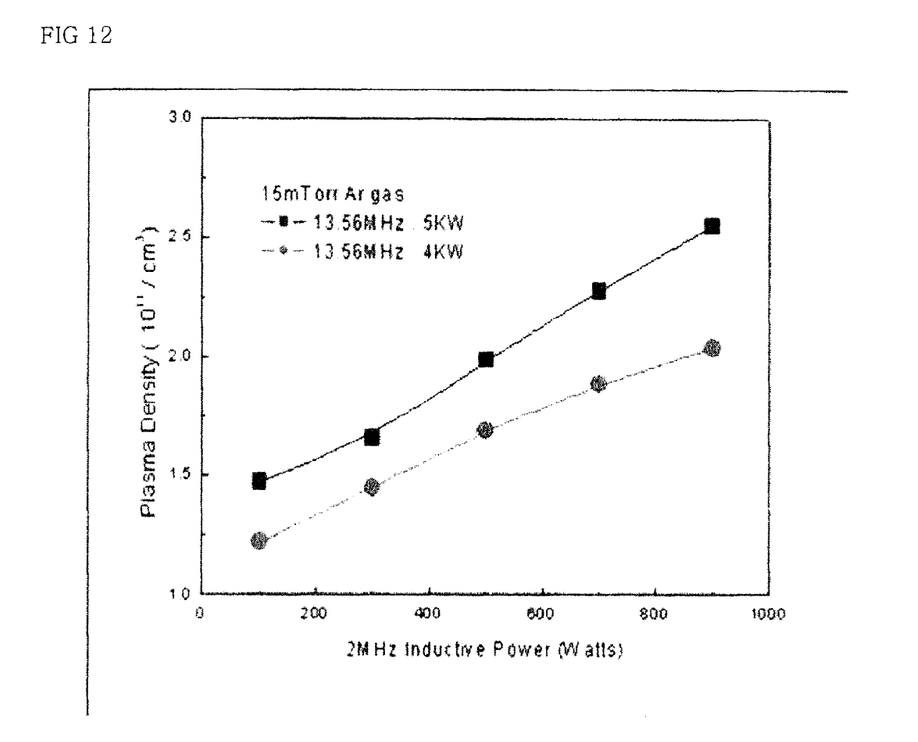
FIG. 12 is a graph of plasma density using a plasma processing apparatus according to the present invention.

As shown in FIG. 12, a high plasma density of $2.5 \times 10^{11}$/ $cm^3$ maximum was obtained according to the input power.

Embodiment 3

Figure 13:
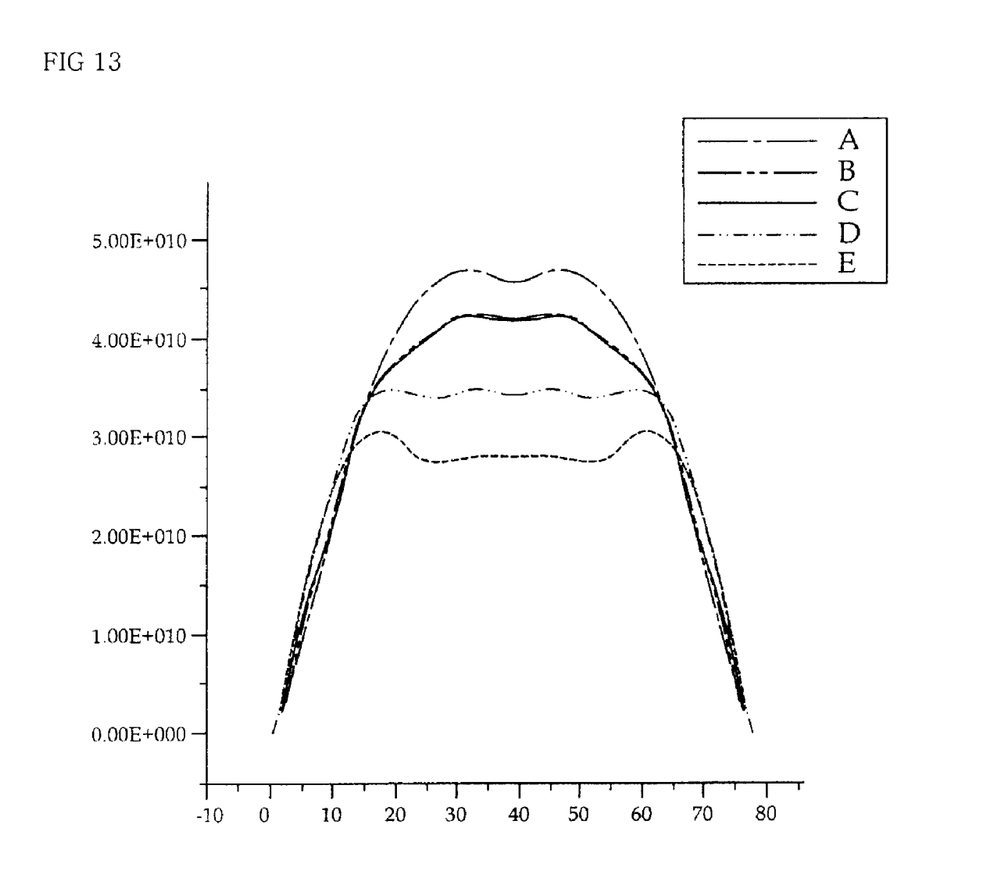
FIG. 13 is a graph of plasma uniformity in various circumstances using a plasma processing apparatus according to the present invention.

In the plasma processing apparatus of the present invention as illustrated in FIG. 9, an input power of 200 W having a dual frequency as in Table 1 below was applied by the RF induced power supply 1700b connected to the right-hand antenna source, and the RF induced power supply 1700a connected to the left-hand antenna source, and then uniformity of plasma was measured. The results are shown in the graph of FIG. 13.

TABLE 1

| | Left-hand Antenna Source (Three Antenna Assemblies) | | Right-hand Antenna Source (Two Antenna Assemblies) | |
|---|---|---|---|---|
| | Frequency (MHz) | Input Power (W) | Frequency (MHz) | Input Power (W) |
| A | 13.56 | 200 | 2 | 200 |
| B | 13.56 | 200 | 13.56 | 200 |
| C | 13.56 | 200 | 27.12 | 200 |
| D | 13.56 | 200 | 40.68 | 200 |
| E | 2 | 200 | 13.56 | 200 |

As a result of the simulation of Embodiment 3, the best result among the five examples was example E, in which the input voltage having a frequency of 2 MHz was used for the left-hand antenna source (three antenna assemblies), and simultaneously the input voltage having a frequency of 13.56 MHz was used for the right-hand antenna source (two antenna assemblies).

In FIG. 13, it was found that example E had high plasma uniformity as electron density was shown to be flat.

General operation of the plasma processing apparatus of the present invention will be described below.

By applying power to the antenna assemblies 1400 arranged in the reaction chamber 1100 in parallel, and discharging plasma, the substrate (not shown) disposed on the stage 1200 is etched.

Meanwhile, because a path along which RF power travels approximately corresponds to the width, the antenna source may be completely free of the standing wave effect.

This type of antenna source can be very efficiently used for plasma discharge over a larger surface area than is conventionally feasible.

As can be seen from the foregoing, the dual-frequency input power is used, and thereby plasma uniformity is improved to the maximum extent. Accordingly, a higher plasma density can be obtained.

Especially, in a process of fabricating semiconductor devices as well as large-sized flat panel displays, uniform plasma can be formed over a large area.

Further, because the diameter of a silicon wafer has increased to 300 mm, and the area of a panel display substrate is increasing, it is considered that a dry etching apparatus will play a significant role in the production of thin film transistor (TFT) liquid crystal displays. In this respect, the present invention is predicted to have a great ripple effect.

The quartz window is additionally provided, and the resin pipe made of Teflon® is interposed between the quartz window and the antenna rod. Thereby, the vacuum state of the vacuum space can be maintained by the resin pipe even when the quartz window is damaged by corrosive gases, so that the plasma processing apparatus can continuously maintain its function.

In addition, as the antenna assemblies and the magnet assemblies are constructed in a module or drawer type, they can be conveniently replaced and easily maintained.

Although exemplary embodiments of the present invention have been described for illustrative purposes, those skilled in the art will appreciate that various modifications, additions and substitutions are possible, without departing from the scope and spirit of the invention as defined by the appended claims and their equivalents.

What is claimed is:

1. A plasma processing apparatus for a very large area, the apparatus comprising:
    a stage loading a substrate to be subjected to an etching or deposition process;
    a reaction chamber detachably coupled with the stage and having a plasma source region;
    a cover covering the reaction chamber;
    an assembly frame coupling the reaction chamber with the cover;
    first and second antenna sources disposed in the plasma source region, and each source having a plurality of antenna assemblies disposed in parallel, the plurality of antenna assemblies having a power supply connected to one side thereof and a ground connected to the other side thereof;
    a plurality of magnet assemblies disposed on both sides of each antenna assembly; and
    a first power supply, connected to the first antenna source, for applying a first power having a first frequency to the first antenna source, and a second power supply, connected to the second antenna source, for applying a second power having a second frequency to the second antenna source, the first frequency and the second frequency being different in magnitude with each other,
    wherein the first and second antenna sources comprise m and m-1 antenna assemblies, respectively, and the antenna assemblies of the first antenna source and the antenna assemblies of the second antenna source are alternately disposed.

2. The apparatus according to claim 1, wherein each of the first power supply and the second power supply is a radio frequency (RF) induced power supply.

3. The apparatus according to claim 2, wherein the first frequency is 2 MHz and the second frequency is 13.56 MHz.

* * * * *